United States Patent
Hori et al.

(10) Patent No.: US 12,125,881 B2
(45) Date of Patent: Oct. 22, 2024

(54) SILICON CARBIDE EPITAXIAL SUBSTRATE AND SILICON CARBIDE SEMICONDUCTOR DEVICE

(71) Applicant: SUMITOMO ELECTRIC INDUSTRIES, LTD., Osaka (JP)

(72) Inventors: Tsutomu Hori, Osaka (JP); Hiromu Shiomi, Osaka (JP); Takaya Miyase, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 897 days.

(21) Appl. No.: 17/274,859

(22) PCT Filed: Aug. 8, 2019

(86) PCT No.: PCT/JP2019/031351
§ 371 (c)(1),
(2) Date: Mar. 10, 2021

(87) PCT Pub. No.: WO2020/115951
PCT Pub. Date: Jun. 11, 2020

(65) Prior Publication Data
US 2022/0059658 A1 Feb. 24, 2022

(30) Foreign Application Priority Data

Dec. 4, 2018 (JP) .................... 2018-227550

(51) Int. Cl.
*H01L 31/0312* (2006.01)
*C30B 25/20* (2006.01)
(Continued)

(52) U.S. Cl.
CPC .......... *H01L 29/1608* (2013.01); *C30B 25/20* (2013.01); *C30B 29/36* (2013.01)

(58) Field of Classification Search
CPC ........... H01L 29/1608; H01L 21/02378; H01L 21/02433; H01L 21/02447; H01L 21/02505; H01L 21/0251; H01L 21/02529
(Continued)

(56) References Cited

U.S. PATENT DOCUMENTS

2019/0040545 A1 2/2019 Nakamura
2020/0006066 A1 1/2020 Konishi

FOREIGN PATENT DOCUMENTS

JP 2011-109018 A 6/2011
JP 2011-114252 A 6/2011
(Continued)

*Primary Examiner* — Kimberly N Rizkallah
*Assistant Examiner* — Dilinh P Nguyen
(74) *Attorney, Agent, or Firm* — Renner, Otto, Boisselle & Sklar, LLP

(57) ABSTRACT

A silicon carbide epitaxial layer includes a first silicon carbide layer, a second silicon carbide layer, a third silicon carbide layer, and a fourth silicon carbide layer. A nitrogen concentration of the second silicon carbide layer is increased from the first silicon carbide layer toward the third silicon carbide layer. A value obtained by dividing, by a thickness of the second silicon carbide layer, a value obtained by subtracting a nitrogen concentration of the first silicon carbide layer from a nitrogen concentration of the third silicon carbide layer is less than or equal to $6 \times 10^{23}$ cm$^{-4}$. Assuming that the nitrogen concentration of the third silicon carbide layer is N cm$^{-3}$ and a thickness of the third silicon carbide layer is X μm, X and N satisfy a Formula 1.

14 Claims, 15 Drawing Sheets

(51) Int. Cl.
  *C30B 29/36* (2006.01)
  *H01L 29/16* (2006.01)
(58) Field of Classification Search
  USPC .......................................................... 257/77
  See application file for complete search history.

(56) References Cited

FOREIGN PATENT DOCUMENTS

| | | | | |
|---|---|---|---|---|
| JP | 5954856 B2 * | 7/2016 | ........... | H01L 29/045 |
| JP | 2017-019679 A | 1/2017 | | |
| JP | 2018-029104 A | 2/2018 | | |
| WO | 2016/092887 A1 | 6/2016 | | |
| WO | 2017/094764 A1 | 6/2017 | | |
| WO | 2018/150861 A1 | 8/2018 | | |

\* cited by examiner

SILICON CARBIDE EPITAXIAL SUBSTRATE AND SILICON CARBIDE SEMICONDUCTOR DEVICE

TECHNICAL FIELD

The present disclosure relates to a silicon carbide epitaxial substrate and a silicon carbide semiconductor device. The present application claims a priority based on Japanese Patent Application No. 2018-227550 filed on Dec. 4, 2018, the entire content of which is incorporated herein by reference.

BACKGROUND ART

WO 2017/094764 (PTL 1) describes a silicon carbide epitaxial substrate having a first silicon carbide layer, a second silicon carbide layer and a third silicon carbide layer. The impurity concentration of the second silicon carbide layer is more than the impurity concentration of the first silicon carbide layer. The impurity concentration of the third silicon carbide layer is less than the impurity concentration of the first silicon carbide layer.

CITATION LIST

Patent Literature

PTL 1: WO 2017/094764

SUMMARY OF INVENTION

A silicon carbide epitaxial substrate according to the present disclosure includes a silicon carbide substrate having a polytype of 4H and a silicon carbide epitaxial layer having a polytype of 4H. The silicon carbide substrate includes a basal plane dislocation. The silicon carbide epitaxial layer is provided on the silicon carbide substrate. The silicon carbide epitaxial layer includes: a first silicon carbide layer provided on the silicon carbide substrate; a second silicon carbide layer provided on the first silicon carbide layer; a third silicon carbide layer provided on the second silicon carbide layer; and a fourth silicon carbide layer provided on the third silicon carbide layer and constituting a front main surface. The front main surface is inclined at an angle of more than 0° and less than or equal to 6° with respect to a {0001} plane. Each of the first silicon carbide layer, the second silicon carbide layer, the third silicon carbide layer, and the fourth silicon carbide layer includes nitrogen. A nitrogen concentration of the second silicon carbide layer is increased from the first silicon carbide layer toward the third silicon carbide layer. A value obtained by dividing, by a thickness of the second silicon carbide layer, a value obtained by subtracting a nitrogen concentration of the first silicon carbide layer from a nitrogen concentration of the third silicon carbide layer is less than or equal to $6 \times 10^{23}$ $cm^{-4}$. Assuming that the nitrogen concentration of the third silicon carbide layer is N $cm^{-3}$ and a thickness of the third silicon carbide layer is X μm, X and N satisfy a Formula 1:

[Formula 1]

$$X > 2.348 \times 10^4 \times \sqrt{\frac{1}{3.3 \times 10^6 + 1.3 \times 10^{-12} \times N + 1.6 \times 10^{-30} \times N^2}}. \quad \text{(Formula 1)}$$

A silicon carbide semiconductor device according to the present disclosure includes a silicon carbide substrate having a polytype of 4H, a silicon carbide epitaxial layer having a polytype of 4H, a first electrode, and a second electrode. The silicon carbide substrate includes a basal plane dislocation. The silicon carbide epitaxial layer is provided on the silicon carbide substrate. The first electrode is provided on the silicon carbide epitaxial layer. The second electrode is in contact with the silicon carbide substrate. The silicon carbide epitaxial layer includes: a first silicon carbide layer provided on the silicon carbide substrate; a second silicon carbide layer provided on the first silicon carbide layer; a third silicon carbide layer provided on the second silicon carbide layer; and a fourth silicon carbide layer provided on the third silicon carbide layer and constituting a front main surface. The front main surface is inclined at an angle of more than 0° and less than or equal to 6° with respect to a {0001} plane. Each of the first silicon carbide layer, the second silicon carbide layer, the third silicon carbide layer, and the fourth silicon carbide layer includes nitrogen. A nitrogen concentration of the second silicon carbide layer is increased from the first silicon carbide layer toward the third silicon carbide layer. A value obtained by dividing, by a thickness of the second silicon carbide layer, a value obtained by subtracting a nitrogen concentration of the first silicon carbide layer from a nitrogen concentration of the third silicon carbide layer is less than or equal to $6 \times 10^{23}$ $cm^{-4}$. Assuming that the nitrogen concentration of the third silicon carbide layer is N $cm^{-3}$ and a thickness of the third silicon carbide layer is X μm, X and N satisfy a Formula 1.

DETAILED DESCRIPTION

Figure 1:
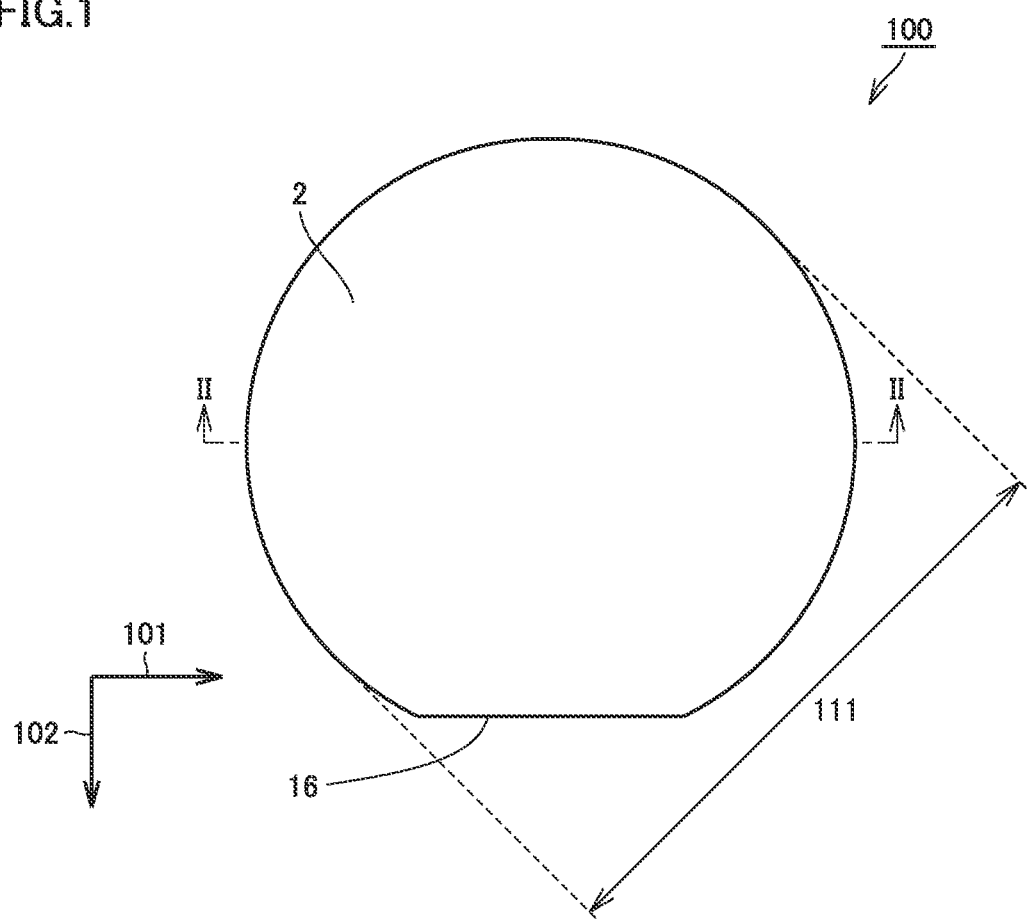
FIG. 1 is a schematic plan view showing a configuration of a silicon carbide epitaxial substrate according to the present embodiment.

Problems to be Solved by the Present Disclosure

It is an object of the present disclosure to provide a silicon carbide epitaxial substrate and a silicon carbide semiconductor device to suppress basal plane dislocations from becoming stacking faults.

Advantageous Effect of the Present Disclosure

According to the present disclosure, there can be provided a silicon carbide epitaxial substrate and a silicon carbide semiconductor device to suppress basal plane dislocations from becoming stacking faults.

DESCRIPTION OF EMBODIMENTS

First, an overview of embodiments of the present disclosure will be described. Regarding crystallographic indications in the present specification, an individual orientation is represented by [ ], a group orientation is represented by < >, and an individual plane is represented by ( ), and a group plane is represented by { }. A crystallographically negative index is normally expressed by putting "-" (bar) above a numeral; however, in the present specification, the crystallographically negative index is expressed by putting a negative sign before the numeral.

(1) A silicon carbide epitaxial substrate 100 according to the present disclosure includes a silicon carbide substrate 1 having a polytype of 4H and a silicon carbide epitaxial layer 9 having a polytype of 4H. Silicon carbide substrate 1 includes a basal plane dislocation 61. Silicon carbide epitaxial layer 9 is provided on silicon carbide substrate 1. Each of silicon carbide substrate 1 and silicon carbide epitaxial layer 9 has a polytype of 4H—SiC. Silicon carbide epitaxial layer 9 includes: a first silicon carbide layer 10 provided on silicon carbide substrate 1; a second silicon carbide layer 20 provided on first silicon carbide layer 10; a third silicon carbide layer 30 provided on second silicon carbide layer 20; and a fourth silicon carbide layer 40 provided on third silicon carbide layer 30 and constituting a front main surface 2. Front main surface 2 is inclined at an angle of more than 0° and less than or equal to 6° with respect to a {0001} plane. Each of first silicon carbide layer 10, second silicon carbide layer 20, third silicon carbide layer 30, and fourth silicon carbide layer 40 includes nitrogen. A nitrogen concentration of second silicon carbide layer 20 is increased from first silicon carbide layer 10 toward third silicon carbide layer 30. A value obtained by dividing, by a thickness of second silicon carbide layer 20, a value obtained by subtracting a nitrogen concentration of first silicon carbide layer 10 from a nitrogen concentration of third silicon carbide layer 30 is less than or equal to $6 \times 10^{23}$ cm$^{-4}$. Assuming that the nitrogen concentration of third silicon carbide layer 30 is N cm$^{-3}$ and a thickness of third silicon carbide layer 30 is X μm, X and N satisfy a Formula 1.

(2) In silicon carbide epitaxial substrate 100 according to (1), X and N may satisfy a Formula 2:

[Formula 2]

$$X > 2.522 \times 10^4 \times \sqrt{\frac{1}{3.3 \times 10^6 + 1.3 \times 10^{-12} \times N + 1.6 \times 10^{-30} \times N^2}}. \quad \text{(Formula 2)}$$

(3) In silicon carbide epitaxial substrate 100 according to (1) or (2), a nitrogen concentration of fourth silicon carbide layer 40 may be less than the nitrogen concentration of third silicon carbide layer 30.

(4) In silicon carbide epitaxial substrate 100 according to any one of (1) to (3), a nitrogen concentration of fourth silicon carbide layer 40 may be less than the nitrogen concentration of first silicon carbide layer 10.

(5) In silicon carbide epitaxial substrate 100 according to any one of (1) to (4), a nitrogen concentration of silicon carbide substrate 1 may be more than the nitrogen concentration of first silicon carbide layer 10 and less than the nitrogen concentration of third silicon carbide layer 30.

(6) In silicon carbide epitaxial substrate 100 according to any one of (1) to (5), the thickness of second silicon carbide layer 20 may be less than or equal to 5 μm.

(7) In silicon carbide epitaxial substrate 100 according to any one of (1) to (6), the thickness of third silicon carbide layer 30 may be less than or equal to 20 μm.

(8) A silicon carbide semiconductor device according to the present disclosure includes a silicon carbide substrate 1 having a polytype of 4H, a silicon carbide epitaxial layer 9 having a polytype of 4H, a first electrode 60, and a second electrode 70. Silicon carbide substrate 1 includes a basal plane dislocation 61. Silicon carbide epitaxial layer 9 is provided on silicon carbide substrate 1. First electrode 60 is provided on silicon carbide epitaxial layer 9. Second electrode 70 is in contact with silicon carbide substrate 1. Each of silicon carbide substrate 1 and silicon carbide epitaxial layer 9 has a polytype of 4H—SiC. Silicon carbide epitaxial layer 9 includes: a first silicon carbide layer 10 provided on silicon carbide substrate 1; a second silicon carbide layer 20 provided on first silicon carbide layer 10; a third silicon carbide layer 30 provided on second silicon carbide layer 20; and a fourth silicon carbide layer 40 provided on third silicon carbide layer 30 and constituting a front main surface 2. Front main surface 2 is inclined at an angle of more than 0° and less than or equal to 6° with respect to a {0001} plane. Each of first silicon carbide layer 10, second silicon carbide layer 20, third silicon carbide layer 30, and fourth silicon carbide layer 40 includes nitrogen. A nitrogen concentration of second silicon carbide layer 20 is increased from first silicon carbide layer 10 toward third silicon carbide layer 30. A value obtained by dividing, by a thickness of second silicon carbide layer 20, a value obtained by subtracting a nitrogen concentration of first silicon carbide layer 10 from a nitrogen concentration of third silicon carbide layer 30 is less than or equal to $6\times10^{23}$ cm$^{-4}$. Assuming that the nitrogen concentration of third silicon carbide layer 30 is N cm$^{-3}$ and a thickness of third silicon carbide layer 30 is X μm, X and N satisfy a Formula 1.

(9) In the silicon carbide semiconductor device according to (8), X and N may satisfy a Formula 2.

(10) In the silicon carbide semiconductor device according to (8) or (9), a nitrogen concentration of fourth silicon carbide layer 40 may be less than the nitrogen concentration of third silicon carbide layer 30.

(11) In the silicon carbide semiconductor device according to any one of (8) to (10), a nitrogen concentration of fourth silicon carbide layer 40 may be less than the nitrogen concentration of first silicon carbide layer 10.

(12) In the silicon carbide semiconductor device according to any one of (8) to (11), a nitrogen concentration of silicon carbide substrate 1 may be more than the nitrogen concentration of first silicon carbide layer 10 and less than the nitrogen concentration of third silicon carbide layer 30.

(13) In the silicon carbide semiconductor device according to any one of (8) to (12), the thickness of second silicon carbide layer 20 may be less than or equal to 5 μm.

(14) In the silicon carbide semiconductor device according to any one of (8) to (13), the thickness of third silicon carbide layer 30 may be less than or equal to 20 μm.

Details of Embodiments of the Present Disclosure

The following describes details of an embodiment of the present disclosure. In the description below, the same or corresponding elements are denoted by the same reference characters and will not be described repeatedly.
(Silicon Carbide Epitaxial Substrate)

Figure 2:
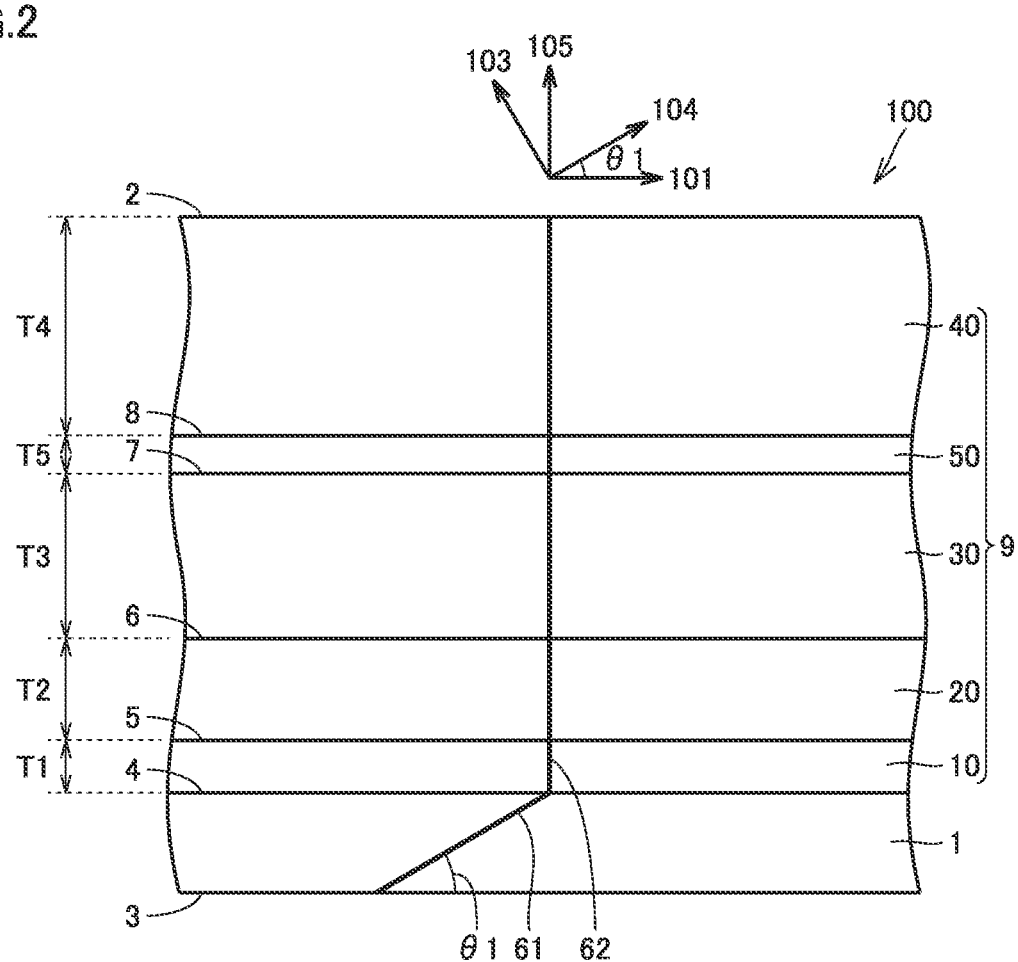
FIG. 2 is a schematic cross sectional view taken along a II-II line of FIG. 1.

As shown in FIGS. 1 and 2, a silicon carbide epitaxial substrate 100 according to the present embodiment has a silicon carbide substrate 1 having a polytype of 4H and a silicon carbide epitaxial layer 9 having a polytype of 4H. Silicon carbide substrate 1 has a first main surface 4 and a second main surface 3 opposite to first main surface 4. Silicon carbide epitaxial layer 9 is in contact with first main surface 4. Silicon carbide epitaxial layer 9 has a front main surface 2 opposite to first main surface 4. Each of silicon carbide substrate 1 and silicon carbide epitaxial layer 9 is composed of hexagonal silicon carbide.

As shown in FIG. 1, silicon carbide epitaxial substrate 100 may be provided with a first flat 16 extending in a first direction 101. Silicon carbide epitaxial substrate 100 may be provided with a second flat (not shown) extending in a second direction 102. Second direction 102 is a <1–100> direction, for example. First direction 101 is a direction parallel to front main surface 2 and perpendicular to second direction 102. First direction 101 is, for example, a direction including a <11–20> direction component. As shown in FIG. 1, second main surface 3 has a diameter 111 (maximum diameter) of, for example, more than or equal to 100 mm. Diameter 111 may be more than or equal to 150 mm, may be more than or equal to 200 mm, or may be more than or equal to 250 mm. The upper limit of diameter 111 is not particularly limited. The upper limit of diameter 111 may be, for example, 300 mm.

Silicon carbide substrate 1 includes nitrogen (N) as an n type impurity. Silicon carbide substrate 1 has n type conductivity. First main surface 4 is inclined at an angle of more than 0° and less than or equal to 6° with respect to a {0001} plane. The thickness of silicon carbide substrate 1 is, for example, more than or equal to 350 μm and less than or equal to 500 μm.

As shown in FIG. 2, silicon carbide epitaxial layer 9 is provided on silicon carbide substrate 1. Silicon carbide epitaxial layer 9 includes nitrogen as an n type impurity. Silicon carbide epitaxial layer 9 has n type conductivity. Front main surface 2 of silicon carbide epitaxial layer 9 is inclined at an angle of more than 0° and less than or equal to 6° with respect to the {0001} plane. Specifically, front main surface 2 may be inclined in an off direction at an angle of more than 0° and less than or equal to 6° with respect to a (0001) plane. Alternatively, front main surface 2 may be inclined in the off direction at an angle of more than 0° and less than or equal to 6° with respect to a (000–1) plane.

The off direction is a <11–20> direction, for example. It should be noted that the off direction is not limited to the <11–20> direction. The off direction may be, for example, a <1–100> direction or may be a direction having a <1–100> direction component and a <11–20> direction component. Off angle θ1 is an angle at which front main surface 2 is inclined with respect to the {0001} plane. Off angle θ1 is, for example, more than 0° and less than or equal to 6°. Off angle θ1 may be more than or equal to 1° or may be more than or equal to 2°. Off angle θ1 may be less than or equal to 7° or may be less than or equal to 6°.

As shown in FIG. 2, a third direction 103 is a direction perpendicular to the {0001} plane. Third direction 103 is, for example, the <0001> direction. A fourth direction 104 is a direction perpendicular to third direction 103. Fourth direction 104 is the <11–20> direction, for example. Fourth direction 104 is the off direction. The normal direction of front main surface 2 is a fifth direction 105. The fifth direction is a direction inclined in the off direction by off angle θ1 with respect to the <0001> direction.

As shown in FIG. 2, silicon carbide epitaxial layer 9 includes a first silicon carbide layer 10, a second silicon carbide layer 20, a third silicon carbide layer 30, a fourth silicon carbide layer 40, and a fifth silicon carbide layer 50. First silicon carbide layer 10 is provided on silicon carbide substrate 1. First silicon carbide layer 10 is in contact with silicon carbide substrate 1. The thickness (first thickness T1) of first silicon carbide layer 10 is, for example, more than or equal to 0.5 μm and less than or equal to 3 μm. Second silicon carbide layer 20 is provided on first silicon carbide layer 10. Second silicon carbide layer 20 is in contact with first silicon carbide layer 10. The thickness (second thickness T2) of second silicon carbide layer 20 is, for example, less than or equal to 5 μm. Second thickness T2 may be, for example, less than or equal to 4.5 μm, or may be less than or equal to 4 μm. The lower limit of second thickness T2 is not particularly limited but is more than or equal to 0.5 μm, for example.

Third silicon carbide layer 30 is provided on second silicon carbide layer 20. Third silicon carbide layer 30 is in contact with second silicon carbide layer 20. The thickness (third thickness T3) of third silicon carbide layer 30 is, for example, less than or equal to 20 μm. Third thickness T3 may be, for example, less than or equal to 18 μm, or may be less than or equal to 16 μm. The lower limit of third thickness T3 is not particularly limited but is more than or equal to 1 μm, for example.

Fifth silicon carbide layer 50 is provided on third silicon carbide layer 30. Fifth silicon carbide layer 50 is in contact with third silicon carbide layer 30. The thickness (fifth thickness T5) of fifth silicon carbide layer 50 is, for example, more than or equal to 0.01 μm and less than or equal to 0.3 μm.

Fourth silicon carbide layer 40 constitutes front main surface 2. Fourth silicon carbide layer 40 is provided on third silicon carbide layer 30. Specifically, fourth silicon carbide layer 40 is provided on third silicon carbide layer 30 with fifth silicon carbide layer 50 being interposed therebetween. Fourth silicon carbide layer 40 is in contact with fifth silicon carbide layer 50. The thickness (fourth thickness T4) of fourth silicon carbide layer 40 is, for example, more than or equal to 3 μm and less than or equal to 50 μm.

As shown in FIG. 2, silicon carbide substrate 1 includes a basal plane dislocation 61. Basal plane dislocation 61 extends from second main surface 3 to first main surface 4. Basal plane dislocation 61 extends on the {0001} plane. Basal plane dislocation 61 extends along fourth direction 104. Basal plane dislocation 61 reaches each of first main surface 4 and second main surface 3. Basal plane dislocation 61 is converted into a threading edge dislocation 62 at an interface between silicon carbide substrate 1 and silicon carbide epitaxial layer 9. Silicon carbide epitaxial layer 9 includes threading edge dislocation 62. Specifically, each of first silicon carbide layer 10, second silicon carbide layer 20, third silicon carbide layer 30, fourth silicon carbide layer 40, and fifth silicon carbide layer 50 includes threading edge dislocation 62. Threading edge dislocation 62 reaches front main surface 2.

Figure 3:
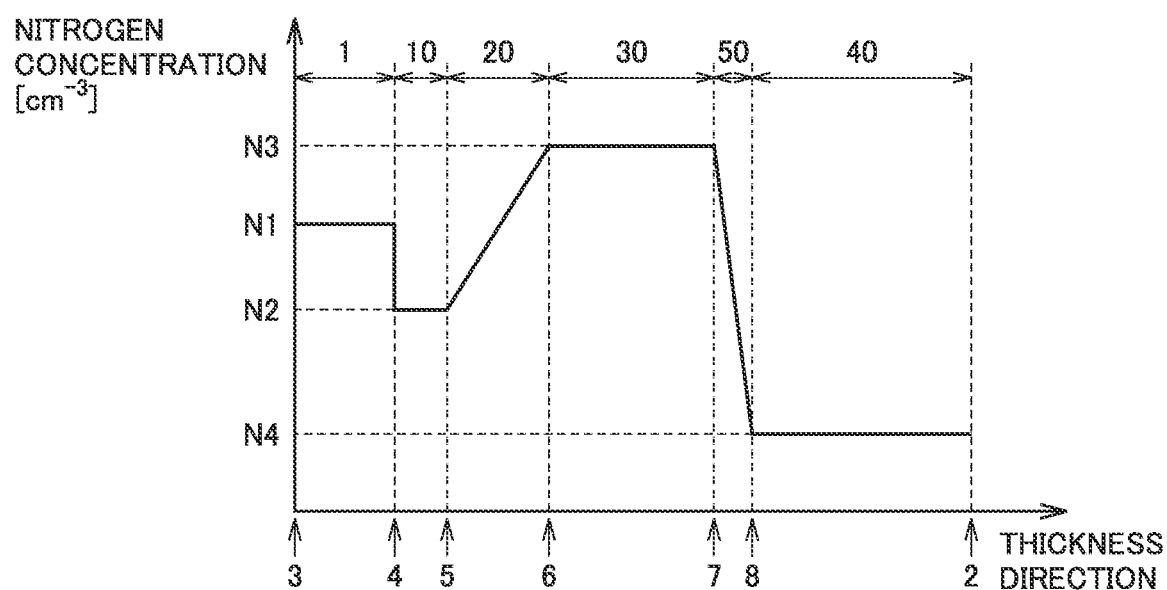
FIG. 3 is a diagram showing a nitrogen concentration distribution in a thickness direction of the silicon carbide epitaxial substrate.

Next, a nitrogen concentration distribution of silicon carbide epitaxial substrate 100 according to the present embodiment will be described. FIG. 3 is a diagram showing a nitrogen concentration distribution in the thickness direction of silicon carbide epitaxial substrate 100.

The nitrogen concentration (first nitrogen concentration N1) of silicon carbide substrate 1 is, for example, more than or equal to $5 \times 10^{18}$ cm$^{-4}$ and less than or equal to $7 \times 10^{18}$ cm$^{-3}$. First nitrogen concentration N1 is an average value of the nitrogen concentration of silicon carbide substrate 1 in the thickness direction. The nitrogen concentration is measured at the center of silicon carbide substrate 1. As shown in FIG. 3, the nitrogen concentration of silicon carbide substrate 1 is substantially constant in the thickness direction. Specifically, in the thickness direction, a ratio of a difference between the maximum value and minimum value of the nitrogen concentration of silicon carbide substrate 1 with respect to the average value thereof (i.e., (the maximum value–the minimum value)/the average value) is less than or equal to 10%.

The nitrogen concentration (second nitrogen concentration N2) of first silicon carbide layer 10 is, for example, more than or equal to $1 \times 10^{18}$ cm$^{-3}$ and less than or equal to $3 \times 10^{18}$ cm$^{-3}$. Second nitrogen concentration N2 is an average value of the nitrogen concentration of first silicon carbide layer 10 in the thickness direction. The nitrogen concentration is measured at the center of first silicon carbide layer 10. As shown in FIG. 3, the nitrogen concentration of first silicon carbide layer 10 is substantially constant in the thickness direction. Specifically, in the thickness direction, a ratio of a difference between the maximum value and minimum value of the nitrogen concentration of first silicon carbide layer 10 with respect to the average value thereof is less than or equal to 10%. Second nitrogen concentration N2 is less than first nitrogen concentration N1.

The nitrogen concentration (third nitrogen concentration N3) of third silicon carbide layer 30 is, for example, more than or equal to $1 \times 10^{18}$ cm$^{-3}$ and less than or equal to $2 \times 10^{19}$ cm$^{-3}$. Third nitrogen concentration N3 is an average value of the nitrogen concentration of third silicon carbide layer 30 in the thickness direction. The nitrogen concentration is measured at the center of third silicon carbide layer 30. As shown in FIG. 3, the nitrogen concentration of third silicon carbide layer 30 is substantially constant in the thickness direction. Specifically, in the thickness direction, a ratio of a difference between the maximum value and minimum value of the nitrogen concentration of third silicon carbide layer 30 with respect to the average value thereof is less than or equal to 10%. Third nitrogen concentration N3 is more than first nitrogen concentration N1. First nitrogen concentration N1 may be more than second nitrogen concentration N2 and less than third nitrogen concentration N3.

As shown in FIG. 3, the nitrogen concentration of second silicon carbide layer 20 is changed in the thickness direction. Specifically, the nitrogen concentration of second silicon carbide layer 20 is increased from first silicon carbide layer 10 toward third silicon carbide layer 30. More specifically, the nitrogen concentration of second silicon carbide layer 20 is substantially monotonously increased from first silicon carbide layer 10 toward third silicon carbide layer 30. The nitrogen concentration is measured at the center of second silicon carbide layer 20.

A value (i.e., the nitrogen concentration gradient of second silicon carbide layer 20) obtained by dividing, by the thickness (second thickness T2) of second silicon carbide layer 20, a value obtained by subtracting the nitrogen concentration (second nitrogen concentration N2) of first silicon carbide layer 10 from the nitrogen concentration (third nitrogen concentration N3) of third silicon carbide layer 30 is less than or equal to $6 \times 10^{23}$ cm$^{-4}$. The nitrogen concentration gradient of second silicon carbide layer 20 may be less than or equal to $2 \cdot 10^{23}$ cm$^{-4}$ or may be less than or equal to $8 \times 10^{23}$ cm$^{-4}$.

The nitrogen concentration (fourth nitrogen concentration N4) of fourth silicon carbide layer 40 is, for example, more than or equal to $1 \times 10^{15}$ cm$^{-3}$ and less than or equal to $3 \times 10^{16}$ cm$^{-3}$. Fourth nitrogen concentration N4 is an average value of the nitrogen concentration of fourth silicon carbide layer 40 in the thickness direction. The nitrogen concentration is measured at the center of fourth silicon carbide layer 40. As shown in FIG. 3, the nitrogen concentration of fourth silicon carbide layer 40 is substantially constant in the thickness direction. Specifically, in the thickness direction, a ratio of a difference between the maximum value and minimum value of the nitrogen concentration of fourth silicon carbide layer 40 with respect to the average value thereof is less than or equal to 10%. Fourth nitrogen concentration N4 is less than second nitrogen concentration N2. Fourth nitrogen concentration N4 is less than third nitrogen concentration N3. Fourth nitrogen concentration N4 is less than first nitrogen concentration N1.

The nitrogen concentration of fifth silicon carbide layer 50 is decreased from third silicon carbide layer 30 toward fourth silicon carbide layer 40. More specifically, the nitrogen concentration of fifth silicon carbide layer 50 is substantially monotonously decreased from a boundary (third boundary 7) between third silicon carbide layer 30 and fifth silicon carbide layer 50 toward a boundary (fourth boundary 8) between fourth silicon carbide layer 40 and fifth silicon carbide layer 50. The nitrogen concentration is measured at the center of fifth silicon carbide layer 50. The absolute value of the nitrogen concentration gradient of fifth silicon carbide layer 50 may be more than the absolute value of the nitrogen concentration gradient of second silicon carbide layer 20.

When a p type region is formed in silicon carbide epitaxial layer 9, positive holes are introduced into silicon carbide epitaxial layer 9. In order to decrease the amount of positive holes to 1/A, the n type impurity layer (third silicon carbide layer 30) needs to have a thickness $X_A$ expressed as Formula 3. Specifically, in order to decrease the amount of positive holes to 1/100, third silicon carbide layer 30 needs to have a thickness $X_{100}$ calculated as L·ln(100). Similarly, in order to decrease the amount of positive holes to 1/1000, third silicon carbide layer 30 needs to have a thickness $X_{1000}$ calculated as L·ln(1000). In Formula 3, L represents a diffusion length of positive holes and ln represents a natural logarithm.
[Formula 3]

$$X_A = L \cdot \ln(A) \quad \text{(Formula 3)}$$

The diffusion length (L) of the positive holes is expressed as Formula 4. In Formula 4, D represents a diffusion coefficient and τ represents a carrier lifetime. Assuming that the temperature is a room temperature and the diffusion rate (μ) is 10 cm$^2$/Vs, D=kT/qμ=0.026 V×10 cm$^2$/Vs=0.26 cm$^2$/s. Here, k represents a Boltzmann's factor, T represents a temperature (K), and q represents 0.026 V. According to T. Tawara et al., "Short minority carrier lifetimes in highly nitrogen-doped 4H—SiC epilayers for suppression of the stacking fault formation in PiN diodes", J. Appl. Phys. 120, 115101(2016), carrier lifetime τ is expressed as Formula 5. In Formula 5, N represents a carrier concentration. Assuming that the nitrogen concentration of third silicon carbide layer 30 is substantially the same as the carrier concentration, a required relation between the nitrogen concentration of third silicon carbide layer 30 and the thickness of third silicon carbide layer 30 to decrease the amount of positive holes to 1/A is obtained by substituting Formula 4 and Formula 5 into Formula 3.
[Formula 4]

$$L = \sqrt{D\tau} \quad \text{(Formula 4)}$$

[Formula 5]

$$\tau^{-1} = 3.3 \times 10^6 + 1.3 \times 10^{-12} \times N + 1.6 \times 10^{-30} \times N^2 \quad \text{(Formula 5)}$$

Figure 4:
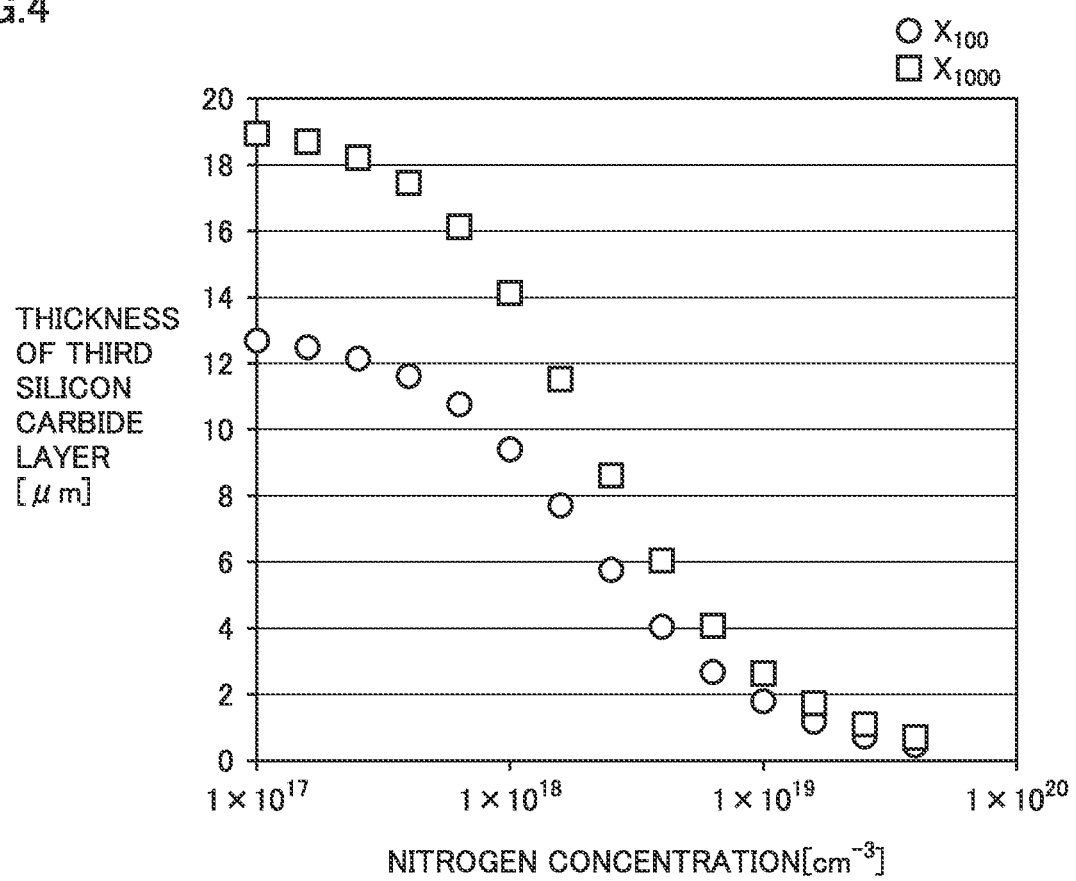
FIG. 4 is a diagram showing a relation between the thickness of the third silicon carbide layer and the nitrogen concentration.

FIG. 4 shows a required relation between the nitrogen concentration of third silicon carbide layer 30 and the thickness of third silicon carbide layer 30 to decrease the amount of positive holes to 1/A. $X_{100}$ in FIG. 4 indicates a required relation between the nitrogen concentration of third silicon carbide layer 30 and the thickness of third silicon carbide layer 30 to decrease the amount of positive holes to 1/100. In order to decrease, to less than 1/100, the amount of positive holes to be introduced into the front main surface 2 side, X and N need to satisfy Formula 1, assuming that the nitrogen concentration of third silicon layer 30 is N cm$^{-3}$ and the thickness of third silicon layer 30 is X μm. $X_{1000}$ of FIG. 4 indicates a required relation between the nitrogen concentration of third silicon carbide layer 30 and the thickness of third silicon carbide layer 30 to decrease the amount of positive holes to 1/1000. In order to decrease, to less than 1/1000, the amount of holes to be introduced into the front main surface 2 side, X and N need to satisfy Formula 2.

Next, a method for measuring the nitrogen concentration of the silicon carbide epitaxial substrate will be described. The nitrogen concentration of the silicon carbide epitaxial substrate can be measured by SIMS (Secondary Ion Mass Spectrometry), for example. A measurement device is, for example, a secondary ion mass spectrometry device provided by Cameca. A measurement pitch is, for example, 0.01 μm. A primary ion beam is cesium (Cs). A primary ion energy is 14.5 eV. A secondary ion polarity is negative. The nitrogen concentration is measured at the center of the silicon carbide epitaxial substrate.

(Manufacturing Apparatus for Silicon Carbide Epitaxial Substrate)

Next, a configuration of a manufacturing apparatus 200 for silicon carbide epitaxial substrate 100 according to the present embodiment will be described.

Figure 5:
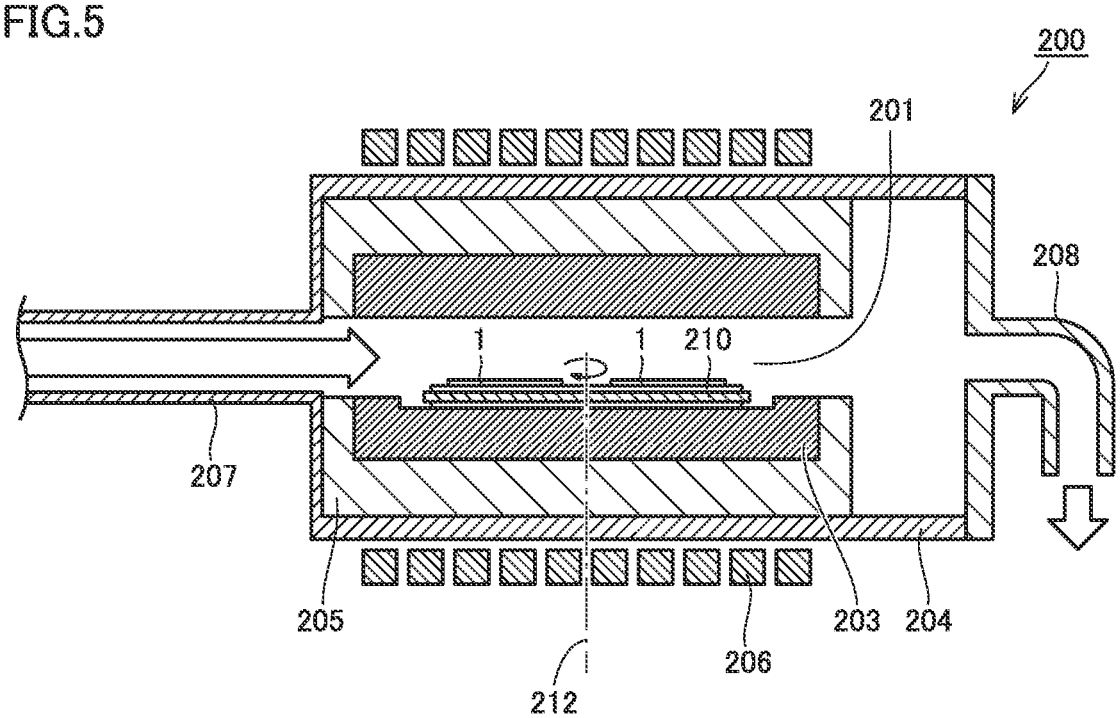
FIG. 5 is a partial schematic cross sectional view showing a configuration of a manufacturing apparatus for the silicon carbide epitaxial substrate according to the present embodiment.

As shown in FIG. 5, manufacturing apparatus 200 for silicon carbide epitaxial substrate 100 is, for example, a hot wall lateral type CVD (Chemical Vapor Deposition) apparatus. Manufacturing apparatus 200 mainly includes a reaction chamber 201, a heating element 203, a quartz tube 204, a heat insulator 205, and an induction heating coil 206.

Heating element 203 has, for example, a tubular shape and has reaction chamber 201 formed therein. Heating element 203 is composed of graphite, for example. Heat insulator 205 surrounds the outer circumference of heating element 203. Heat insulator 205 is provided inside quartz tube 204 so as to be in contact with the inner circumferential surface of quartz tube 204. Induction heating coil 206 is wound along the outer circumferential surface of quartz tube 204, for example. Induction heating coil 206 can be supplied with alternating current by an external power supply (not shown). Accordingly, heating element 203 is inductively heated. As a result, reaction chamber 201 is heated by heating element 203.

Reaction chamber 201 is a space formed to be surrounded by heating element 203. Silicon carbide substrate 1 is placed in reaction chamber 201. Reaction chamber 201 can heat silicon carbide substrate 1. Reaction chamber 201 is provided with a susceptor 210 for holding silicon carbide substrate 1. Susceptor 210 is rotatable around a rotation axis 212.

Manufacturing apparatus 200 has a gas inlet 207 and a gas outlet 208. Gas outlet 208 is connected to a discharging pump (not shown). Arrows in FIG. 5 indicate a flow of gas. The gas is introduced from gas inlet 207 into reaction chamber 201 and is discharged from gas outlet 208. A pressure in reaction chamber 201 is adjusted by balancing an amount of supply of the gas and an amount of discharging of the gas.

Manufacturing apparatus 200 has a gas supplying unit (not shown) that can supply reaction chamber 201 with a mixed gas including silane, ammonia, hydrogen, and propane, for example. Specifically, the gas supplying unit may include: a gas cylinder that can supply propane gas; a gas cylinder that can supply hydrogen gas; a gas cylinder that can supply silane gas; and a gas cylinder that can supply ammonia gas.

The winding density of induction heating coil 206 may be changed in the axis direction of reaction chamber 201. The winding density [the number of turns/m] refers to the number of times of winding the coil per unit length in the axis direction of the apparatus. For example, in order to effectively thermally decompose ammonia on the upstream side, the winding density of induction heating coil 206 on the upstream side may be higher than the winding density of induction heating coil 206 on the downstream side.

(Method for Manufacturing Silicon Carbide Epitaxial Substrate)

Next, a method for manufacturing silicon carbide epitaxial substrate 100 according to the present embodiment will be described.

First, silicon carbide substrate 1 is prepared. For example, a sublimation method is used to produce a silicon carbide single crystal having a polytype of 4H—SiC. Next, for example, a wire saw is used to slice the silicon carbide single crystal, thereby preparing silicon carbide substrate 1. Silicon carbide substrate 1 includes nitrogen as an n type impurity. Silicon carbide substrate 1 has n type conductivity.

Figure 6:
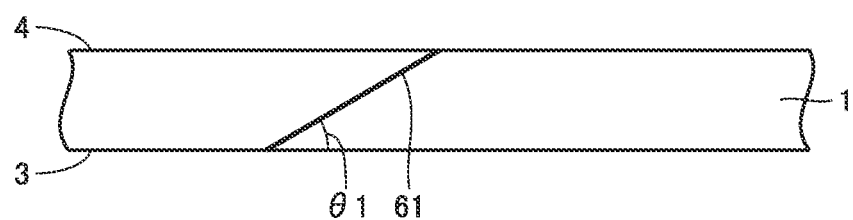
FIG. 6 is a schematic cross sectional view showing a first step of a method for manufacturing a silicon carbide epitaxial substrate according to the present embodiment.

As shown in FIG. 6, silicon carbide substrate 1 has first main surface 4 and second main surface 3 opposite to first main surface 4. First main surface 4 corresponds to a plane inclined in the off direction by off angle θ1 with respect to the {0001} plane, for example. Off angle θ1 is more than 0° and less than 6°. The off direction is the <11–20> direction, for example. The diameter of first main surface 4 of silicon carbide substrate 1 is, for example, 150 mm. In silicon carbide substrate 1, basal plane dislocations 61 exist at an area density of 500/cm$^2$ to 2000/cm$^2$, for example. Each of basal plane dislocations 61 extends in a direction parallel to the {0001} plane.

Next, silicon carbide substrate 1 is placed on susceptor 210 in reaction chamber 201 (see FIG. 5). For example, a pressure in reaction chamber 201 is decreased from an atmospheric pressure to about $1\times10^{-6}$ Pa, and then silicon carbide substrate 1 is heated to, for example, about 1600° C.

Next, first silicon carbide layer 10 (buffer layer) is formed. Specifically, a mixed gas including silane gas, propane gas, ammonia gas and hydrogen gas is supplied to reaction chamber 201. In reaction chamber 201, each of the gases is thermally decomposed to cause epitaxial growth of first silicon carbide layer 10 on silicon carbide substrate 1. Susceptor 210 rotates around rotation axis 212. Silicon carbide substrate 1 is rotated around rotation axis 212 (see FIG. 5).

In the step of forming first silicon carbide layer 10, the flow rate of each of the silane gas, the propane gas, the ammonia gas and the hydrogen gas is adjusted as follows. Specifically, the flow rate of the silane gas is adjusted to be, for example, 60 sccm. The flow rate of the propane gas is adjusted to be, for example, 19 sccm. The flow rate of the hydrogen gas is adjusted to be, for example, 130 slm. The flow rate of the ammonia gas is adjusted to be, for example, 0.05 sccm. As described above, first silicon carbide layer 10 is formed on silicon carbide substrate 1 (see FIG. 7).

Figure 7:
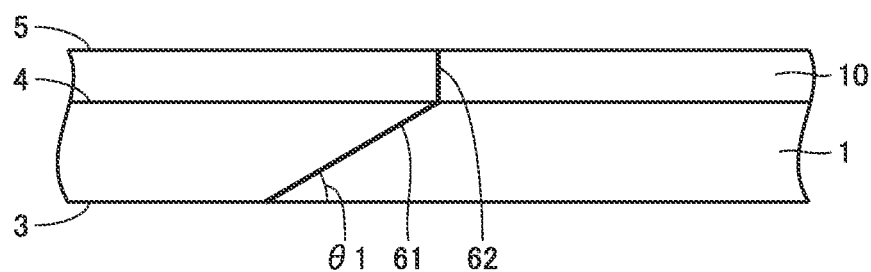
FIG. 7 is a schematic cross sectional view showing a second step of the method for manufacturing the silicon carbide epitaxial substrate according to the present embodiment.

As shown in FIG. 7, at the interface (first main surface 4) between silicon carbide substrate 1 and first silicon carbide layer 10, more than or equal to 99.9% of basal plane dislocations 61 in silicon carbide substrate 1 are converted into threading edge dislocations 62. Each of threading edge dislocations 62 extends through first silicon carbide layer 10.

Next, second silicon carbide layer 20 is formed. Specifically, a mixed gas including silane gas, propane gas, ammonia gas and hydrogen gas is supplied to reaction chamber 201. In reaction chamber 201, each of the gases is thermally decomposed to cause epitaxial growth of second silicon carbide layer 20 on first silicon carbide layer 10.

Figure 8:
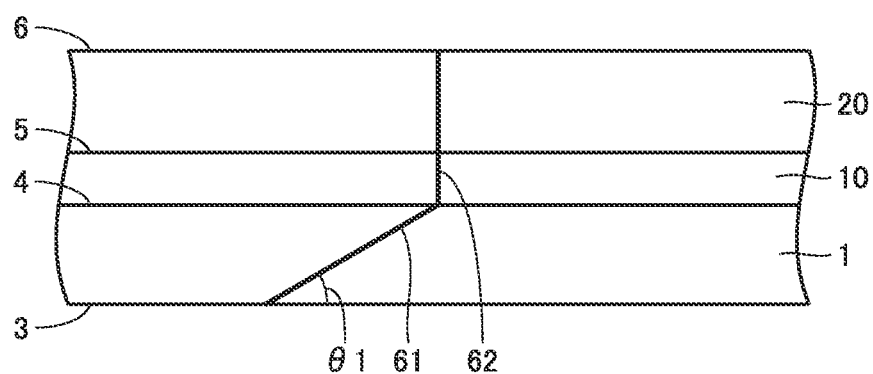
FIG. 8 is a schematic cross sectional view showing a third step of the method for manufacturing the silicon carbide epitaxial substrate according to the present embodiment.

In the step of forming second silicon carbide layer 20, the flow rate of each of the silane gas, the propane gas, the ammonia gas and the hydrogen gas is adjusted as follows. Specifically, the flow rate of the silane gas is adjusted to be, for example, 60 sccm. The flow rate of the propane gas is adjusted to be, for example, 19 sccm. The flow rate of the hydrogen gas is adjusted to be, for example, 130 slm. The flow rate of the ammonia gas is adjusted to be increased as time elapses. Specifically, the flow rate of the ammonia gas is adjusted to be monotonously increased from 0.05 sccm to 0.5 sccm, for example. In this way, second silicon carbide layer 20 is formed on first silicon carbide layer 10 (see FIG. 8). More than or equal to 99.9% of threading edge dislocations 62 converted from basal plane dislocations 61 extend through second silicon carbide layer 20 without change. That is, threading edge dislocations 62 are reverted to basal plane dislocations 61 at a ratio of less than or equal to 0.1%.

Next, third silicon carbide layer 30 is formed. Specifically, a mixed gas including silane gas, propane gas, ammonia gas and hydrogen gas is supplied to reaction chamber 201. In reaction chamber 201, each of the gases is thermally decomposed to cause epitaxial growth of third silicon carbide layer 30 on second silicon carbide layer 20.

Figure 9:
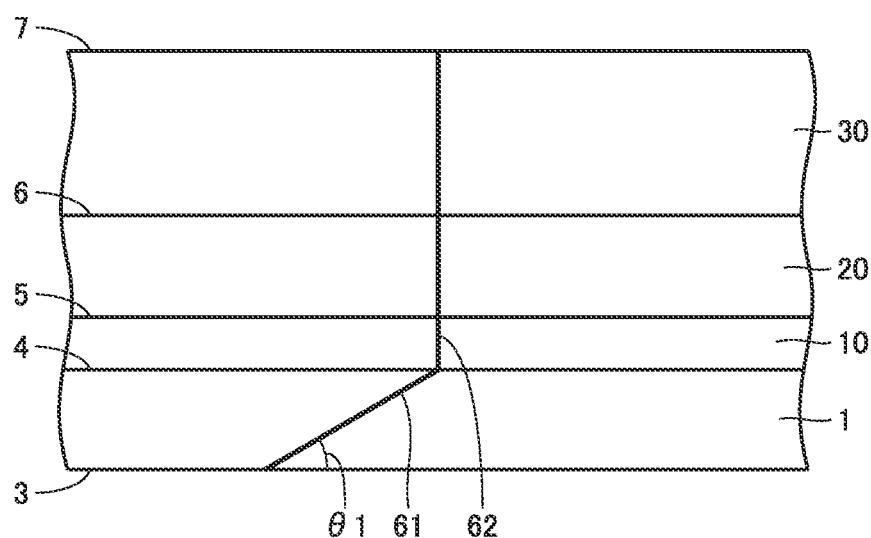
FIG. 9 is a schematic cross sectional view showing a fourth step of the method for manufacturing the silicon carbide epitaxial substrate according to the present embodiment.

In the step of forming third silicon carbide layer 30, the flow rate of each of the silane gas, the propane gas, the ammonia gas and the hydrogen gas is adjusted as follows. Specifically, the flow rate of the silane gas is adjusted to be, for example, 140 sccm. The flow rate of the propane gas is adjusted to be, for example, 63 sccm. The flow rate of the hydrogen gas is adjusted to be, for example, 130 slm. The flow rate of the ammonia gas is adjusted to be, for example, 0.5 sccm. In this way, third silicon carbide layer 30 is formed on second silicon carbide layer 20 (see FIG. 9). Each of threading edge dislocations 62 extends through third silicon carbide layer 30.

Next, fifth silicon carbide layer 50 is formed. Specifically, a mixed gas including silane gas, propane gas, ammonia gas and hydrogen gas is supplied to reaction chamber 201. In reaction chamber 201, each of the gases is thermally decomposed to cause epitaxial growth of fifth silicon carbide layer 50 on third silicon carbide layer 30.

In the step of forming fifth silicon carbide layer 50, the flow rate of each of the silane gas, the propane gas, the ammonia gas and the hydrogen gas is adjusted as follows. Specifically, the flow rate of the silane gas is adjusted to be, for example, 140 sccm. The flow rate of the propane gas is adjusted to be, for example, 63 sccm. The flow rate of the hydrogen gas is adjusted to be, for example, 130 slm. The flow rate of the ammonia gas is adjusted to be decreased as time elapses. Specifically, the flow rate of the ammonia gas is adjusted to be monotonously decreased from 0.5 sccm to 0.02 sccm, for example. In this way, fifth silicon carbide layer 50 is formed on third silicon carbide layer 30. Each of threading edge dislocations 62 extends through fifth silicon carbide layer 50.

Next, fourth silicon carbide layer 40 (drift layer) is formed. Specifically, a mixed gas including silane gas, propane gas, ammonia gas and hydrogen gas is supplied to reaction chamber 201. In reaction chamber 201, each of the gases is thermally decomposed to cause epitaxial growth of fourth silicon carbide layer 40 on fifth silicon carbide layer 50.

In the step of forming fourth silicon carbide layer 40, the flow rate of each of the silane gas, the propane gas, the ammonia gas and the hydrogen gas is adjusted as follows. Specifically, the flow rate of the silane gas is adjusted to be, for example, 140 sccm. The flow rate of the propane gas is adjusted to be, for example, 63 sccm. The flow rate of the hydrogen gas is adjusted to be, for example, 130 slm. The flow rate of the ammonia gas is adjusted to be, for example, 0.02 sccm. In this way, fourth silicon carbide layer 40 is formed on fifth silicon carbide layer 50. Each of threading edge dislocations 62 extends through fourth silicon carbide layer 40.

In this way, silicon carbide epitaxial substrate 100 having silicon carbide substrate 1 and silicon carbide epitaxial layer 9 is manufactured (see FIG. 2). Silicon carbide epitaxial layer 9 includes first silicon carbide layer 10, second silicon carbide layer 20, third silicon carbide layer 30, fourth silicon carbide layer 40, and fifth silicon carbide layer 50.

(Silicon Carbide Semiconductor Device)

Next, a configuration of a silicon carbide semiconductor device 300 according to the present embodiment will be described.

Figure 10:
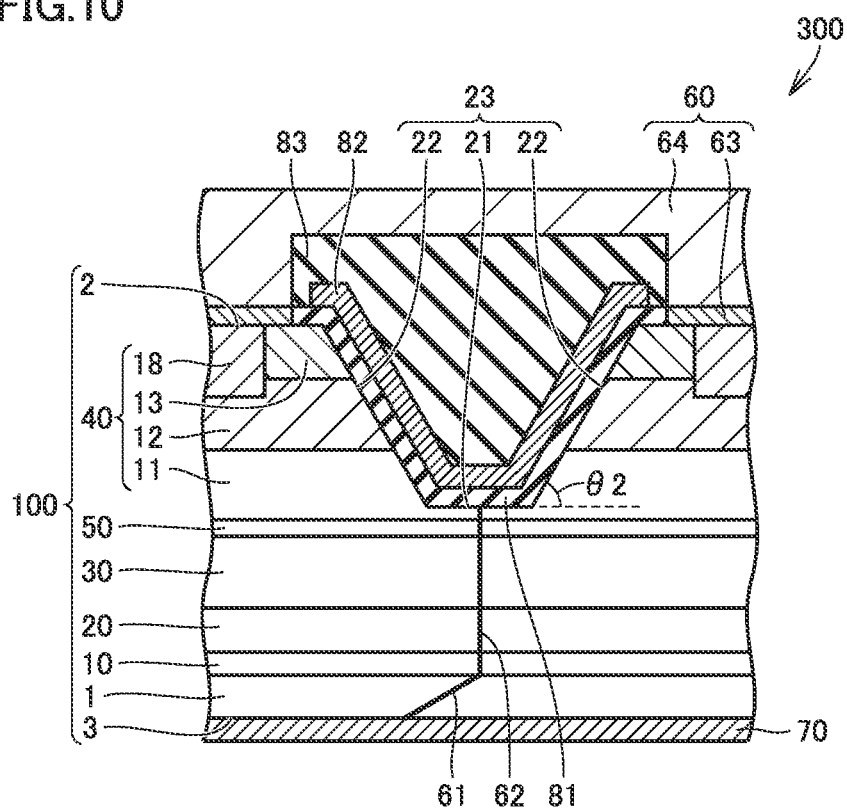
FIG. 10 is a schematic cross sectional view showing a configuration of a silicon carbide semiconductor device according to the present embodiment.

As shown in FIG. 10, a MOSFET 300 according to the present embodiment mainly has silicon carbide epitaxial substrate 100, a gate insulating film 81, a gate electrode 82, an interlayer insulating film 83, a source electrode 60, and a drain electrode 70. The configuration of silicon carbide epitaxial substrate 100 has been described above (see FIG. 2). Silicon carbide epitaxial substrate 100 includes silicon carbide substrate 1 and silicon carbide epitaxial layer 9. Silicon carbide epitaxial layer 9 includes first silicon carbide layer 10, second silicon carbide layer 20, third silicon carbide layer 30, fourth silicon carbide layer 40, and fifth silicon carbide layer 50. Fourth silicon carbide layer 40 includes a drift region 11, a body region 12, a source region 13, and a contact region 18.

Silicon carbide substrate 1 includes a basal plane dislocation 61. Basal plane dislocation 61 extends on the {0001} plane. Silicon carbide epitaxial layer 9 includes a threading edge dislocation 62. Specifically, each of first silicon carbide layer 10, second silicon carbide layer 20, third silicon carbide layer 30, fourth silicon carbide layer 40, and fifth silicon carbide layer 50 includes threading edge dislocation 62. Threading edge dislocation 62 may reach a bottom surface 21 of a gate trench 23, may reach a side surface 22 of gate trench 23, or may reach front main surface 2.

Drift region 11 is provided on fifth silicon carbide layer 50. Drift region 11 is in contact with fifth silicon carbide layer 50. Drift region 11 includes nitrogen as an n type impurity and has n type conductivity. Drift region 11 is an n type impurity region. The nitrogen concentration of drift region 11 is less than the nitrogen concentration of first silicon carbide layer 10. The nitrogen concentration of drift region 11 is, for example, more than or equal to $1\times10^5$ cm$^{-3}$ and less than or equal to $3\times10^{16}$ cm$^{-3}$.

Body region 12 is provided on drift region 11. Body region 12 includes a p type impurity such as aluminum (Al) and has p type conductivity. Body region 12 is a p type impurity region. The concentration of the p type impurity of body region 12 may be more than the concentration of the n type impurity of drift region 11. Body region 12 is separated from front main surface 2.

Source region 13 is provided on body region 12 so as to be separated from drift region 11 by body region 12. Source region 13 includes an n type impurity such as nitrogen or phosphorus (P) and has n type conductivity. Source region 13 constitutes a portion of front main surface 2. The concentration of the n type impurity of source region 13 may be more than the concentration of the p type impurity of body region 12. The concentration of the n type impurity of source region 13 is, for example, more than or equal to $1\times10^{17}$ cm$^{-3}$ and less than or equal to $1\times10^{19}$ cm$^{-3}$.

Contact region 18 includes a p type impurity such as aluminum and has p type conductivity. The concentration of the p type impurity of contact region 18 is more than the concentration of the p type impurity of body region 12. Contact region 18 extends through source region 13 and is in contact with body region 12. Contact region 18 constitutes a portion of front main surface 2. The concentration of the p type impurity of contact region 18 is, for example, more than or equal to $1\times10^{18}$ cm$^{-3}$ and less than or equal to $1\times10^{0}$ cm$^{-3}$.

As shown in FIG. 10, gate trench 23 has side surface 22 and bottom surface 21. Side surface 22 is continuous to front main surface 2. Bottom surface 21 is continuous to side surface 22. Side surface 22 extends through source region 13 and body region 12 to reach drift region 11. From a different point of view, it can be said that side surface 22 is constituted of source region 13, body region 12 and drift region 11. Bottom surface 21 is located in drift region 11. From a different point of view, it can be said that bottom surface 21 is constituted of drift region 11. Bottom surface 21 is separated from fifth silicon carbide layer 50. Similarly, the bottom surface is separated from third silicon carbide layer 30. Bottom surface 21 is, for example, a flat surface parallel to front main surface 2. An angle θ2 of side surface 22 with respect to a plane including bottom surface 21 is, for example, more than or equal to 45° and less than or equal to 65°. Angle θ2 may be, for example, more than or equal to 50°. Angle θ2 may be, for example, less than or equal to 60°.

Gate insulating film 81 is, for example, an oxide film. Gate insulating film 81 is composed of a material including silicon dioxide, for example. Gate insulating film 81 is in contact with side surface 22 and bottom surface 21. Gate insulating film 81 is in contact with drift region 11 at bottom surface 21. Gate insulating film 81 is in contact with source region 13, body region 12 and drift region 11 at side surface 22. Gate insulating film 81 may be in contact with source region 13 at front main surface 2.

Gate electrode 82 is provided on gate insulating film 81. Gate electrode 82 is composed of, for example, polysilicon including an electrically conductive impurity. Gate electrode 82 is disposed inside gate trench 23. Specifically, gate electrode 82 is disposed inside gate trench 23. A portion of gate electrode 82 may be disposed on front main surface 2. Gate electrode 82 faces drift region 11, body region 12 and source region 13.

Source electrode 60 (first electrode 60) is in contact with front main surface 2. Source electrode 60 has a contact electrode 63 and a source wiring 64. Source wiring 64 is provided on contact electrode 63. Contact electrode 63 is in contact with source region 13 at front main surface 2. Contact electrode 63 may be in contact with contact region 18 at front main surface 2. Contact electrode 63 is composed of a material including, for example, Ti (titanium), Al (aluminum), and Si (silicon). Contact electrode 63 is in ohmic contact with source region 13. Contact electrode 63 may be in ohmic contact with contact region 18.

Drain electrode 70 (second electrode 70) is in contact with second main surface 3. Drain electrode 70 is in contact with silicon carbide substrate 1 at second main surface 3. Drain electrode 70 is electrically connected to drift region 11. Drain electrode 70 is composed of a material including, for example, NiSi (nickel silicon) or TiAlSi (titanium aluminum silicon).

Interlayer insulating film 83 is provided in contact with each of gate electrode 82 and gate insulating film 81. Interlayer insulating film 83 is composed of a material including, for example, silicon dioxide. Interlayer insulating film 83 electrically insulates gate electrode 82 and source electrode 60 from each other. A portion of interlayer insulating film 83 may be provided inside gate trench 23. Source wiring 64 covers interlayer insulating film 83. Source wiring 64 is composed of, for example, a material including Al.

(Method for Manufacturing Silicon Carbide Semiconductor Device)

Next, a method for manufacturing silicon carbide semiconductor device 300 according to the present embodiment will be described.

Figure 11:
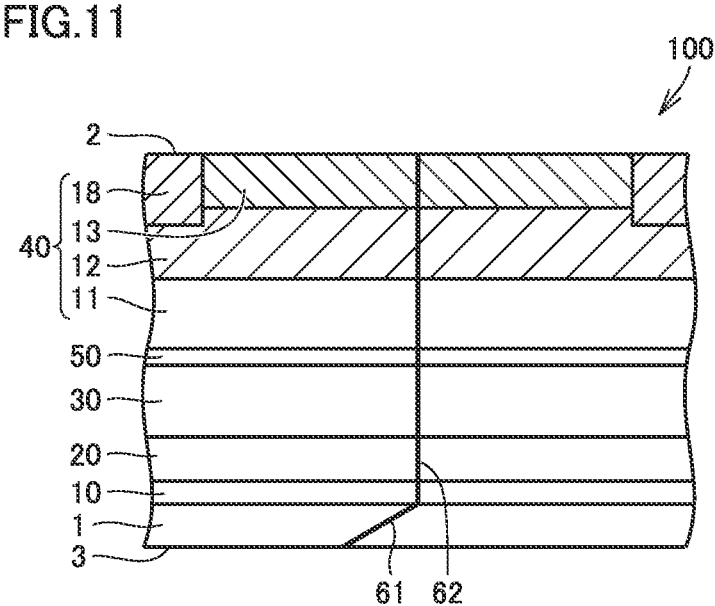
FIG. 11 is a schematic cross sectional view showing a first step of a method for manufacturing the silicon carbide semiconductor device according to the present embodiment.

First, silicon carbide epitaxial substrate 100 described above is prepared (see FIG. 2). Next, ion implantation is performed into silicon carbide epitaxial substrate 100. For example, p type impurity ions for providing p type conductivity, such as aluminum ions, are implanted into the whole of the surface of drift region 11. Accordingly, body region 12 is formed. Next, ions of an n type impurity such as phosphorus (P) are implanted into the whole of the surface of body region 12. Accordingly, source region 13 is formed. Next, a mask layer (not shown) is formed which is provided with an opening above a region in which contact region 18 is to be formed. Next, p type impurity ions for providing p type conductivity, such as aluminum ions, are implanted into source region 13. Accordingly, contact region 18 is formed in contact with each of source region 13 and body region 12 (see FIG. 11).

Next, activation annealing is performed to activate the impurity ions implanted in silicon carbide epitaxial substrate 100. The temperature of the activation annealing is preferably more than or equal to 1500° C. and less than or equal to 1900° C., for example, about 1700° C. The activation annealing is performed for about 30 minutes, for example. An atmosphere for the activation annealing is preferably an inert gas atmosphere such as an Ar atmosphere.

Figure 12:
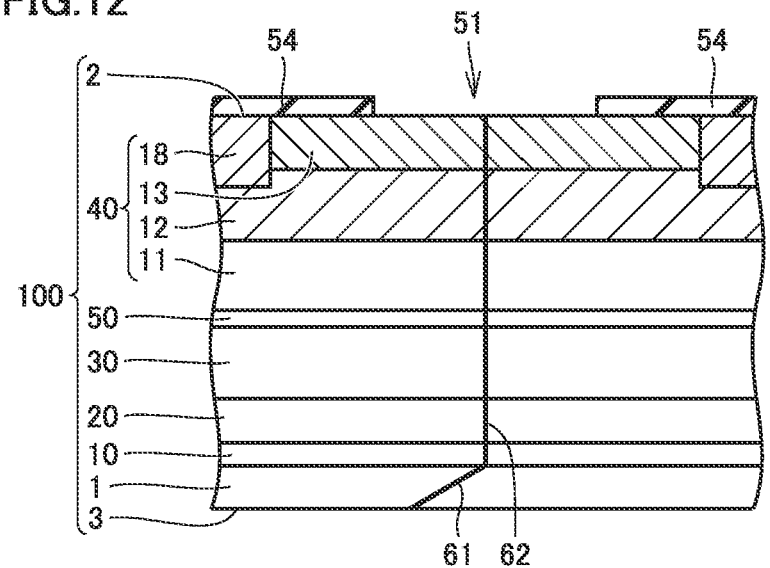
FIG. 12 is a schematic cross sectional view showing a second step of the method for manufacturing the silicon carbide semiconductor device according to the present embodiment.

Next, a mask layer 54 is formed on silicon carbide epitaxial substrate 100 (see FIG. 12). An opening (first opening 51) is formed in mask layer 54. Mask layer 54 is in contact with source region 13 and contact region 18. First opening 51 provided in mask layer 54 is located above source region 13.

Next, gate trench 23 is formed. First, silicon carbide epitaxial substrate 100 is etched with mask layer 54 provided with first opening 51 being formed on front main surface 2. Specifically, for example, a portion of source region 13 and a portion of body region 12 are removed by etching. As an etching method, reactive ion etching, in particular, inductively coupled plasma reactive ion etching can be used, for example. For example, there can be used inductively coupled plasma reactive ion etching employing sulfur hexafluoride ($SF_6$) or a mixed gas of $SF_6$ and oxygen ($O_2$) as a reactive gas. By the etching, a recess is formed in a region in which gate trench 23 is to be formed. The recess has: a side portion substantially perpendicular to front main surface 2; and a bottom provided to be continuous to the side portion and substantially parallel to front main surface 2.

Next, thermal etching is performed in the recess. The thermal etching may be performed by performing heating in an atmosphere including a reactive gas having at least one or more types of halogen atoms with mask layer 54 being formed on front main surface 2. The at least one or more types of halogen atoms include at least one of chlorine (Cl) atom and fluorine (F) atom. Such an atmosphere includes, for example, chlorine ($Cl_2$), boron trichloride ($BCl_3$), $SF_6$, or carbon tetrafluoride ($CF_4$)). For example, the thermal etching is performed using a mixed gas of chlorine gas and oxygen gas as a reactive gas at a heat treatment temperature of, for example, more than or equal to 800° C. and less than or equal to 900° C. It should be noted that the reactive gas may include a carrier gas in addition to the chlorine gas and the oxygen gas. As the carrier gas, for example, nitrogen gas, argon gas, helium gas or the like can be used. In this way, gate trench 23 is formed in front main surface 2 of silicon carbide epitaxial substrate 100.

Figure 13:
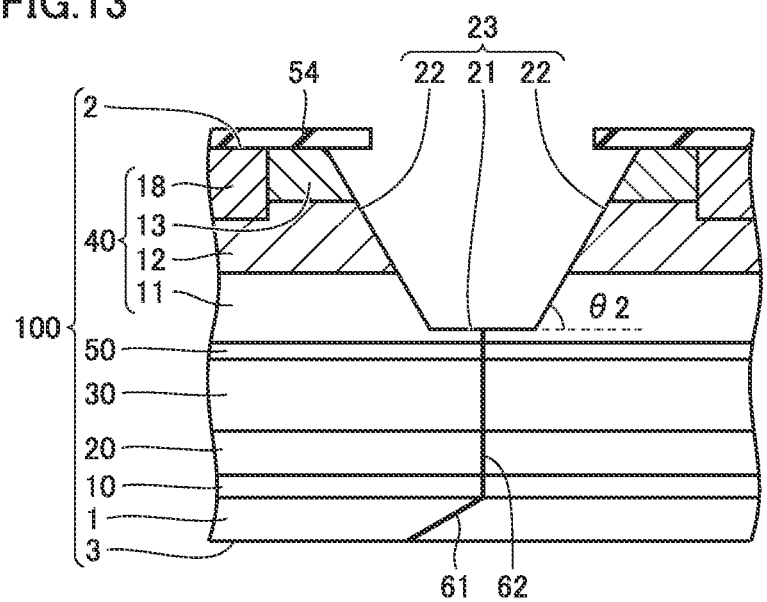
FIG. 13 is a schematic cross sectional view showing a third step of the method for manufacturing the silicon carbide semiconductor device according to the present embodiment.

As shown in FIG. 13, gate trench 23 has side surface 22 and bottom surface 21. Side surface 22 extends through source region 13 and body region 12 to reach drift region 11. From a different point of view, it can be said that side surface 22 is constituted of source region 13, body region 12 and drift region 11. Bottom surface 21 is located in drift region 11. From a different point of view, it can be said that bottom surface 21 is constituted of drift region 11. Bottom surface 21 is, for example, a flat surface parallel to second main surface 3. Angle θ2 of side surface 22 with respect to the plane including bottom surface 21 is, for example, more than or equal to 450 and less than or equal to 65°. Angle θ2 may be, for example, more than or equal to 50°. Angle θ2 may be, for example, less than or equal to 60°.

Figure 14:
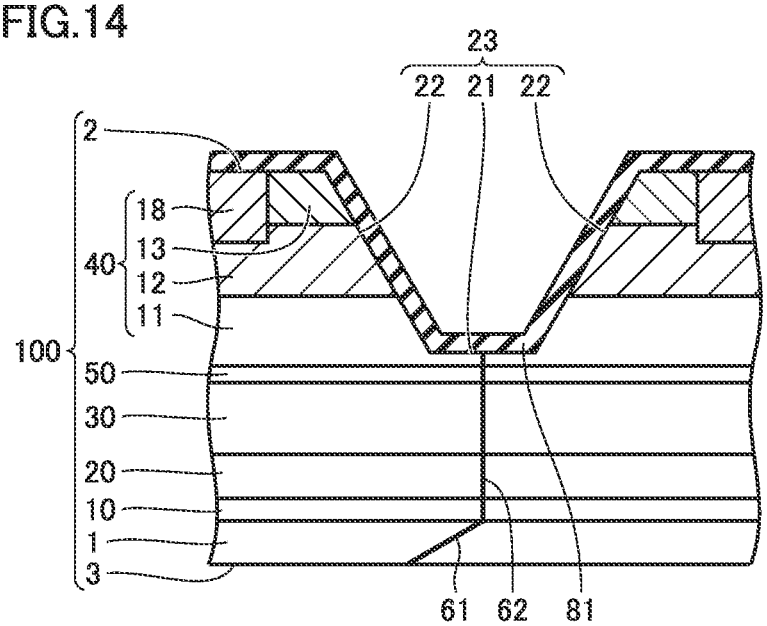
FIG. 14 is a schematic cross sectional view showing a fourth step of the method for manufacturing the silicon carbide semiconductor device according to the present embodiment.

Next, the gate insulating film is formed. For example, by thermally oxidizing silicon carbide epitaxial substrate 100, gate insulating film 81 is formed in contact with source region 13, body region 12, drift region 11, contact region 18, and front main surface 2 (see FIG. 14). Specifically, silicon carbide epitaxial substrate 100 is heated in an atmosphere including oxygen at a temperature of, for example, more than or equal to 1300° C. and less than or equal to 1400° C. In this way, gate insulating film 81 is formed in contact with gate trench 23.

Next, heat treatment (NO annealing) may be performed onto silicon carbide epitaxial substrate 100 in a nitrogen monoxide (NO) gas atmosphere. In the NO annealing, silicon carbide epitaxial substrate 100 is held for about 1 hour at more than or equal to 1100° C. and less than or equal to 1400° C., for example. Accordingly, nitrogen atoms are introduced into the interface region between gate insulating film 81 and body region 12. As a result, formation of interface states in the interface region is suppressed, thereby achieving improved channel mobility.

After the NO annealing, Ar annealing may be performed using argon (Ar) as an atmospheric gas. The heating temperature in the Ar annealing is more than or equal to the heating temperature in the NO annealing, for example. The Ar annealing is performed for about 1 hour, for example. Accordingly, the formation of interface states can be further suppressed in the interface region between gate insulating film 81 and body region 12. It should be noted that instead of the Ar gas, a different inert gas such as nitrogen gas can be employed as the atmospheric gas.

Next, a step of forming the gate electrode is performed. Gate electrode 82 is formed on gate insulating film 81. Gate electrode 82 is formed by, for example, an LP-CVD (Low Pressure Chemical Vapor Deposition) method. Gate electrode 82 is formed to face each of source region 13, body region 12 and drift region 11.

Next, a step of forming interlayer insulating film 83 is performed. Specifically, interlayer insulating film 83 is formed in contact with gate insulating film 81 so as to cover gate electrode 82. Interlayer insulating film 83 is formed by the CVD method, for example. Interlayer insulating film 83 is composed of, for example, silicon dioxide. A portion of interlayer insulating film 83 may be formed inside gate trench 23.

Figure 15:
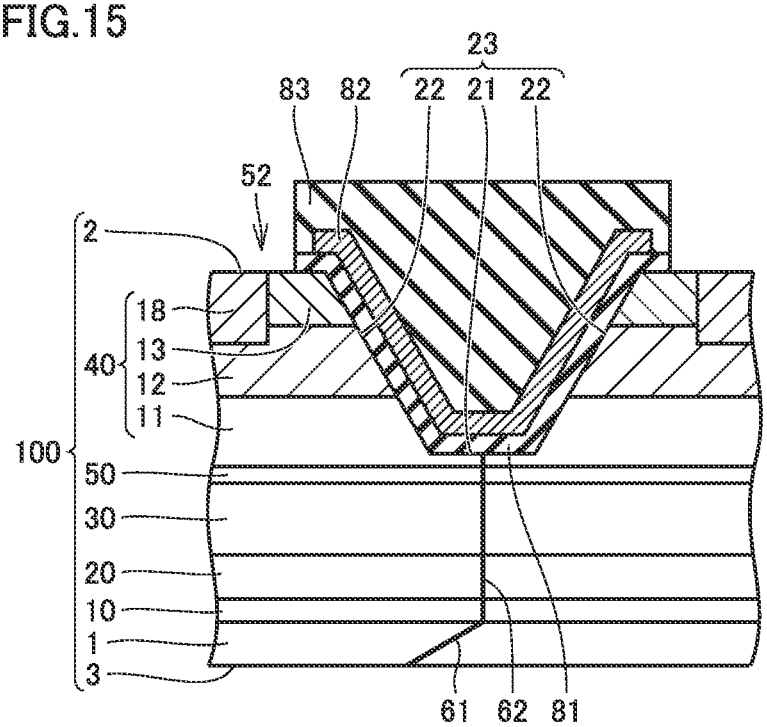
FIG. 15 is a schematic cross sectional view showing a fifth step of the method for manufacturing the silicon carbide semiconductor device according to the present embodiment.

Next, a step of forming source electrode 60 is performed. Source electrode 60 has contact electrode 63 and source wiring 64. First, etching is performed to form an opening (second opening 52) in interlayer insulating film 83 and gate insulating film 81. Accordingly, in second opening 52, source region 13 and contact region 18 are exposed through interlayer insulating film 83 and gate insulating film 81 (see FIG. 15). Next, contact electrode 63 is formed on front main surface 2 in contact with source region 13 and contact region 18. Contact electrode 63 is formed, for example, by a sputtering method. Contact electrode 63 is composed of, for example, a material including Ti, Al and Si.

Next, alloying annealing is performed. Contact electrode 63 in contact with source region 13 and contact region 18 is held at a temperature of more than or equal to 900° C. and less than or equal to 1100° C. for about 5 minutes, for example. Accordingly, at least a portion of contact electrode 63 reacts with silicon included in silicon carbide epitaxial substrate 100 to cause silicidation. Thus, contact electrode 63 is formed in ohmic contact with source region 13. Contact electrode 63 may be in ohmic contact with contact region 18. Next, source wiring 64 is formed in contact with contact electrode 63.

Next, a step of forming drain electrode 70 is performed. For example, by the sputtering method, drain electrode 70 is formed in contact with second main surface 3. Drain electrode 70 is composed of, for example, a material including NiSi or TiAlSi. In this way, MOSFET 300 (see FIG. 10) according to the present embodiment is completed.

Although the silicon carbide semiconductor device according to the present disclosure has been described above by illustratively describing the MOSFET, the silicon carbide semiconductor device according to the present disclosure is not limited to the MOSFET. The silicon carbide semiconductor device according to the present disclosure is applicable to, for example, an IGBT (Insulated Gate Bipolar Transistor), SBD (Schottky Barrier Diode), a thyristor, a GTO (Gate Turn Off thyristor), a PN diode, and the like.

Next, the following describes functions and effects of silicon carbide epitaxial substrate 100 and the silicon carbide semiconductor device according to the present embodiment.

For example, during an operation of the silicon carbide semiconductor device such as a PN diode, positive holes are introduced into the front surface side of silicon carbide epitaxial substrate 100. When the positive holes reach basal plane dislocations 61 during movement of the positive holes from the front surface electrode (first electrode 60) side to the backside electrode (second electrode 70) side, basal plane dislocations 61 are expanded to become stacking faults. When basal plane dislocations 61 become stacking faults, a flow of current is significantly hindered to result in increased on resistance of the silicon carbide semiconductor device.

In the case where there are basal plane dislocations 61 in silicon carbide substrate 1, when the positive holes are moved from silicon carbide epitaxial layer 9 to silicon carbide substrate 1, basal plane dislocations 61 become stacking faults in silicon carbide substrate 1. In order to suppress basal plane dislocations 61 from becoming stacking faults in silicon carbide substrate 1, it is necessary to sufficiently reduce positive holes in silicon carbide epitaxial layer 9 provided on silicon carbide substrate 1.

An amount of positive holes to be introduced into the silicon carbide semiconductor device depends on the density of current to flow in the silicon carbide semiconductor device. For example, in the case of a silicon carbide semiconductor device for a vehicular application, a current density to be used is about more than or equal to 100 A/cm$^2$ and less than or equal to 1000 A/cm$^2$. When the current density is about 100 A/cm$^2$, an amount of positive holes to reach silicon carbide substrate 1 is desirably less than or equal to 1/100 of the amount of introduced positive holes. When the current density is about 1000 A/cm$^2$, the amount of positive holes to reach silicon carbide substrate 1 is desirably less than or equal to 1/1000 of the amount of introduced positive holes.

The inventors have reviewed a method for suppressing positive holes, which are introduced into silicon carbide epitaxial layer 9, from reaching silicon carbide substrate 1. As a result, it has been found that the positive holes introduced into silicon carbide epitaxial layer 9 can be effectively suppressed from reaching silicon carbide substrate 1 by providing a positive hole suppression layer (third silicon carbide layer) in the silicon carbide epitaxial layer and by controlling the thickness of the third silicon carbide layer and the nitrogen concentration of third silicon carbide layer 30 to have predetermined values. Specifically, assuming that the nitrogen concentration of third silicon layer 30 is N cm$^{-3}$ and the thickness of third silicon carbide layer 30 is X μm, X and N satisfy Formula 1.

Further, the inventors have reviewed a method for preventing basal plane dislocations 61 in silicon carbide substrate 1 from being transferred to front main surface 2 of silicon carbide epitaxial layer 9. As a result, it has been found that basal plane dislocations 61 in silicon carbide substrate 1 can be effectively suppressed from being transferred to front main surface 2 of silicon carbide epitaxial layer 9 by providing, between first silicon carbide layer 10 and third silicon carbide layer 30, second silicon carbide layer 20 having a nitrogen concentration gradient and by controlling the nitrogen concentration gradient to be less than or equal to a predetermined value. Specifically, a value obtained by dividing, by the thickness of second silicon carbide layer 20, a value obtained by subtracting a nitrogen concentration at a boundary between second silicon carbide layer 20 and first silicon carbide layer 10 from a nitrogen concentration at a boundary between second silicon carbide layer 20 and third silicon carbide layer 30 is less than or equal to 6×10$^{23}$ cm$^{-1}$.

As described above, according to each of silicon carbide epitaxial substrate 100 and the silicon carbide semiconductor device according to the present embodiment, by providing third silicon carbide layer 30 satisfying Formula 1, the amount of positive holes to reach silicon carbide substrate 1 can be significantly reduced. Therefore, in silicon carbide substrate 1, basal plane dislocations 61 can be suppressed from becoming stacking faults. Further, by providing second silicon carbide layer 20 having a predetermined nitrogen concentration gradient, basal plane dislocations 61 in silicon carbide substrate 1 can be suppressed from being transferred to front main surface 2 of silicon carbide epitaxial layer 9. Therefore, in silicon carbide epitaxial layer 9, basal plane dislocations 61 can be suppressed from becoming stacking faults. That is, according to each of silicon carbide epitaxial substrate 100 and the silicon carbide semiconductor device according to the present embodiment, basal plane dislocations 61 can be suppressed from becoming stacking faults.

Examples (Preparation of Samples)

First, silicon carbide epitaxial substrates 100 according to samples 1 to 17 were prepared. Each of silicon carbide epitaxial substrates 100 according to samples 1 to 17 has a silicon carbide substrate 1 and a silicon carbide epitaxial layer 9 (see FIG. 2). Silicon carbide substrate 1 includes basal plane dislocations 61. Silicon carbide epitaxial layer 9 includes a first silicon carbide layer 10, a second silicon carbide layer 20, a third silicon carbide layer 30, a fourth silicon carbide layer 40, and a fifth silicon carbide layer 50.

The nitrogen concentration of second silicon carbide layer 20 is changed in the thickness direction. The nitrogen concentration gradient of second silicon carbide layer 20 in the thickness direction is shown in Table 1. Each of silicon carbide epitaxial substrates 100 according to samples 1 to 17 was manufactured using the above-described manufacturing method.

The thickness of first silicon carbide layer 10 of silicon carbide epitaxial substrate 100 according to each of samples 1 to 17 is 1 μm. The thickness of second silicon carbide layer 20 of silicon carbide epitaxial substrate 100 according to each of samples 1 to 3 and 7 to 11 is 1 μm. The thickness of second silicon carbide layer 20 of silicon carbide epitaxial substrate 100 according to each of samples 4 to 6 was 2.5 μm. The thickness of second silicon carbide layer 20 of silicon carbide epitaxial substrate 100 according to each of samples 12 to 17 is 0.1 μm. The thickness of third silicon carbide layer 30 of silicon carbide epitaxial substrate 100 according to each of samples 1 to 6 and 12 to 17 is 10 μm. The thickness of third silicon carbide layer 30 of silicon carbide epitaxial substrate 100 according to each of samples 7 to 11 is 5 μm.

the etch pits originated from threading edge dislocations 62 is a hexagonal shape. By observing the shape of each of the etch pits as described above, it is determined whether or not there are basal plane dislocations 61 in front main surface 2.

(Results of Evaluations on Basal Plane Dislocations)

As shown in Table 1, basal plane dislocations 61 were found in front main surface 2 of silicon carbide epitaxial substrate 100 according to each of samples 12 and 14 to 17. On the other hand, basal plane dislocations 61 were not found in front main surface 2 of silicon carbide epitaxial substrate 100 according to each of samples 1 to 11 and 13. That is, basal plane dislocations 61 were not found when the nitrogen concentration gradient of second silicon carbide layer 20 (the value obtained by dividing, by the thickness of second silicon carbide layer 20, the value obtained by subtracting the nitrogen concentration at the boundary between second silicon carbide layer 20 and first silicon carbide layer 10 from the nitrogen concentration at the boundary between second silicon carbide layer 20 and third silicon carbide layer 30) was less than or equal to $6\times10^{23}$ cm$^{-4}$. On the other hand, when the nitrogen concentration gradient of second silicon carbide layer 20 was more than

TABLE 1

| Sample Number Unit | Nitrogen Concentration of First Silicon Carbide Layer cm$^{-3}$ | Nitrogen Concentration of Third Silicon Carbide Layer cm$^{-3}$ | Nitrogen Concentration Gradient of Second Silicon Carbide Layer cm$^{-4}$ | Thickness of First Silicon Carbide Layer μm | Thickness of Second Silicon Carbide Layer μm | Thickness of Third Silicon Carbide Layer μm | Basal Plane Dislocation |
|---|---|---|---|---|---|---|---|
| Sample 1  | $2.87 \times 10^{17}$ | $1.80 \times 10^{19}$ | $1.77 \times 10^{23}$ | 1 | 1   | 10 | Not Exist |
| Sample 2  | $7.55 \times 10^{17}$ | $6.70 \times 10^{18}$ | $5.95 \times 10^{22}$ | 1 | 1   | 10 | Not Exist |
| Sample 3  | $1.93 \times 10^{18}$ | $1.10 \times 10^{19}$ | $9.07 \times 10^{22}$ | 1 | 1   | 10 | Not Exist |
| Sample 4  | $2.87 \times 10^{17}$ | $1.80 \times 10^{19}$ | $7.09 \times 10^{22}$ | 1 | 2.5 | 10 | Not Exist |
| Sample 5  | $7.55 \times 10^{17}$ | $6.70 \times 10^{18}$ | $2.38 \times 10^{22}$ | 1 | 2.5 | 10 | Not Exist |
| Sample 6  | $1.93 \times 10^{18}$ | $1.10 \times 10^{19}$ | $3.63 \times 10^{22}$ | 1 | 2.5 | 10 | Not Exist |
| Sample 7  | $1.20 \times 10^{18}$ | $2.19 \times 10^{19}$ | $2.07 \times 10^{23}$ | 1 | 1   | 5  | Not Exist |
| Sample 8  | $9.32 \times 10^{17}$ | $8.20 \times 10^{18}$ | $7.27 \times 10^{22}$ | 1 | 1   | 5  | Not Exist |
| Sample 9  | $2.00 \times 10^{18}$ | $1.25 \times 10^{19}$ | $1.05 \times 10^{23}$ | 1 | 1   | 5  | Not Exist |
| Sample 10 | $8.70 \times 10^{17}$ | $8.20 \times 10^{18}$ | $7.33 \times 10^{22}$ | 1 | 1   | 5  | Not Exist |
| Sample 11 | $8.80 \times 10^{17}$ | $1.13 \times 10^{19}$ | $1.04 \times 10^{23}$ | 1 | 1   | 5  | Not Exist |
| Sample 12 | $2.87 \times 10^{17}$ | $1.80 \times 10^{19}$ | $1.77 \times 10^{24}$ | 1 | 0.1 | 10 | Exist |
| Sample 13 | $7.55 \times 10^{17}$ | $6.70 \times 10^{18}$ | $5.95 \times 10^{23}$ | 1 | 0.1 | 10 | Not Exist |
| Sample 14 | $1.93 \times 10^{18}$ | $1.10 \times 10^{19}$ | $9.07 \times 10^{23}$ | 1 | 0.1 | 10 | Exist |
| Sample 15 | $8.12 \times 10^{15}$ | $1.80 \times 10^{19}$ | $1.80 \times 10^{24}$ | 1 | 0.1 | 10 | Exist |
| Sample 16 | $8.00 \times 10^{15}$ | $6.70 \times 10^{18}$ | $6.69 \times 10^{23}$ | 1 | 0.1 | 10 | Exist |
| Sample 17 | $8.22 \times 10^{15}$ | $1.10 \times 10^{19}$ | $1.10 \times 10^{24}$ | 1 | 0.1 | 10 | Exist |

(Method for Evaluating Basal Plane Dislocations)

An evaluation is made as to presence or absence of basal plane dislocations 61 (BPD) in front main surface 2 of silicon carbide epitaxial substrate 100 according to each of samples 1 to 17. Whether or not there are basal plane dislocations 61 in front main surface 2 can be evaluated by an etch pit method. In the etch pit method, a potassium hydroxide (KOH) melt is used as an etching liquid. The temperature of the KOH melt is about 500 to 550° C. An etching time is about 5 to 10 minutes. After the etching, front main surface 2 is observed using an optical microscope. The measurement is performed at nine positions in the plane of front main surface 2.

When there are basal plane dislocations 61 in front main surface 2, etch pits originated from basal plane dislocations 61 are observed in front main surface 2. A typical shape of each of the etch pits originated from basal plane dislocations 61 is an elliptical shape. On the other hand, when there are no basal plane dislocations 61 in front main surface 2, etch pits originated from threading edge dislocations 62 are observed in front main surface 2. A typical shape of each of $6\times10^{23}$ cm$^{-4}$, basal plane dislocations 61 were found. It was confirmed that when the nitrogen concentration gradient of second silicon carbide layer 20 is less than or equal to $6\times10^{23}$ cm$^{-4}$ as described above, basal plane dislocations 61 in silicon carbide epitaxial layer 9 can be reduced. In other words, it was confirmed that when the nitrogen concentration gradient of second silicon carbide layer 20 is less than or equal to $6\times10^{23}$ cm$^{-4}$, threading edge dislocations 62 converted from basal plane dislocations 61 in first silicon carbide layer 10 are reverted to basal plane dislocations 61 at a ratio of less than or equal to 0.1%.

The embodiments and examples disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: silicon carbide substrate; 2: front main surface; 3: second main surface; 4: first main surface; 5: first boundary; 6: second boundary; 7: third boundary; 8: fourth boundary; 9: silicon carbide epitaxial layer; 10: first silicon carbide layer; 11: drift region; 12: body region; 13: source region; 16: first flat; 18: contact region; 20: second silicon carbide layer; 21: bottom surface; 22: side surface; 23: gate trench; 30: third silicon carbide layer; 40: fourth silicon carbide layer; 50: fifth silicon carbide layer; 51: first opening; 52: second opening; 54: mask layer; 60: source electrode (first electrode); 61: basal plane dislocation; 62: threading edge dislocation; 63: contact electrode; 64: source wiring; 70: drain electrode (second electrode); 81: gate insulating film; 82: gate electrode; 83: interlayer insulating film; 100: silicon carbide epitaxial substrate; 101: first direction; 102: second direction; 103: third direction; 104: fourth direction; 105: fifth direction; 111: diameter; 200: manufacturing apparatus; 201: reaction chamber; 203: heating element; 204: quartz tube; 205: heat insulator; 206: induction heating coil; 207: gas inlet; 208: gas outlet; 210: susceptor; 212: rotation axis; 300: silicon carbide semiconductor device (MOSFET); N1: first nitrogen concentration; N2: second nitrogen concentration; N3: third nitrogen concentration; N4: fourth nitrogen concentration; T1: first thickness; T2: second thickness; T3: third thickness; T4: fourth thickness; T5: fifth thickness; θ1: off angle; θ2: angle.

The invention claimed is:

1. A silicon carbide epitaxial substrate comprising:
a silicon carbide substrate including a basal plane dislocation and having a polytype of 4H; and
a silicon carbide epitaxial layer provided on the silicon carbide substrate and having a polytype of 4H, wherein
the silicon carbide epitaxial layer includes
  a first silicon carbide layer provided on the silicon carbide substrate,
  a second silicon carbide layer provided on the first silicon carbide layer,
  a third silicon carbide layer provided on the second silicon carbide layer,
  a fourth silicon carbide layer provided on the third silicon carbide layer and constituting a front main surface, and
  a fifth silicon carbide layer provided on the third silicon carbide layer,
wherein the fourth silicon carbide layer is provided on the third silicon carbide layer with the fifth silicon carbide layer being interposed between the fourth silicon carbide layer and the third silicon carbide layer,
the front main surface is inclined at an angle of more than 0° and less than or equal to 6° with respect to a (0001) plane,
each of the first silicon carbide layer, the second silicon carbide layer, the third silicon carbide layer, the fifth silicon carbide layer, and the fourth silicon carbide layer includes nitrogen,
a nitrogen concentration of the second silicon carbide layer is increased from the first silicon carbide layer toward the third silicon carbide layer,
a nitrogen concentration of the fifth silicon carbide layer is decreased from the third silicon carbide layer toward the fourth silicon carbide layer,
an absolute value of a nitrogen concentration gradient of the fifth silicon carbide layer is more than an absolute value of a nitrogen concentration gradient of the second silicon carbide layer, a value obtained by dividing, by a thickness of the second silicon carbide layer, a value obtained by subtracting a nitrogen concentration of the first silicon carbide layer from a nitrogen concentration of the third silicon carbide layer is less than or equal to $6\times10^{23}$ cm$^{-4}$, and
wherein the nitrogen concentration of the third silicon carbide layer is N cm$^{-3}$ and a thickness of the third silicon carbide layer is X µm, and X and N satisfy a Formula 1:

$$X > 2.348 \times 10^4 \times \sqrt{\frac{1}{3.3 \times 10^6 + 1.3 \times 10^{-12} \times N + 1.6 \times 10^{-30} \times N^2}}.$$ (Formula 1)

2. The silicon carbide epitaxial substrate according to claim 1, wherein X and N satisfy a Formula 2:

$$X > 3.522 \times 10^4 \times \sqrt{\frac{1}{3.3 \times 10^6 + 1.3 \times 10^{-12} \times N + 1.6 \times 10^{-30} \times N^2}}.$$ (Formula 2)

3. The silicon carbide epitaxial substrate according to claim 1, wherein a nitrogen concentration of the fourth silicon carbide layer is less than the nitrogen concentration of the third silicon carbide layer.

4. The silicon carbide epitaxial substrate according to claim 1, wherein a nitrogen concentration of the fourth silicon carbide layer is less than the nitrogen concentration of the first silicon carbide layer.

5. The silicon carbide epitaxial substrate according to claim 1, wherein a nitrogen concentration of the silicon carbide substrate is more than the nitrogen concentration of the first silicon carbide layer and less than the nitrogen concentration of the third silicon carbide layer.

6. The silicon carbide epitaxial substrate according to claim 1, wherein the thickness of the second silicon carbide layer is less than or equal to 5 µm.

7. The silicon carbide epitaxial substrate according to claim 1, wherein the thickness of the third silicon carbide layer is less than or equal to 20 µm.

8. A silicon carbide semiconductor device comprising:
a silicon carbide substrate including a basal plane dislocation and having a polytype of 4H;
a silicon carbide epitaxial layer provided on the silicon carbide substrate and having a polytype of 4H;
a first electrode provided on the silicon carbide epitaxial layer; and
a second electrode in contact with the silicon carbide substrate, wherein
each of the silicon carbide substrate and the silicon carbide epitaxial layer has a polytype of 4H—SiC,
the silicon carbide epitaxial layer includes
  a first silicon carbide layer provided on the silicon carbide substrate,
  a second silicon carbide layer provided on the first silicon carbide layer,
  a third silicon carbide layer provided on the second silicon carbide layer, a fourth silicon carbide layer provided on the third silicon carbide layer and constituting a front main surface, and a fifth silicon carbide layer provided on the third silicon carbide layer, wherein the fourth silicon carbide layer is provided on the third silicon carbide layer with the fifth silicon carbide layer being interposed between the fourth silicon carbide layer and the third silicon carbide layer, the front main surface is inclined at an angle of more than 0° and less than or equal to 6° with respect to a (0001) plane, each of the first silicon carbide layer, the second silicon carbide layer, the third silicon carbide layer, the fifth silicon carbide layer, and the fourth silicon carbide layer includes nitrogen, a nitrogen concentration of the second silicon carbide layer is increased from the first silicon carbide layer toward the third silicon carbide layer, a nitrogen concentration of the fifth silicon carbide layer is decreased from the third silicon carbide layer toward the fourth silicon carbide layer, an absolute value of a nitrogen concentration gradient of the fifth silicon carbide layer is more than an absolute value of a nitrogen concentration gradient of the second silicon carbide layer, a value obtained by dividing, by a thickness of the second silicon carbide layer, a value obtained by subtracting a nitrogen concentration of the first silicon carbide layer from a nitrogen concentration of the third silicon carbide layer is less than or equal to $6 \times 10^{23}$ cm$^{-4}$, and wherein the nitrogen concentration of the third silicon carbide layer is N cm$^{-3}$ and a thickness of the third silicon carbide layer is X μm, and X and N satisfy a Formula 1:

$$X > 2.348 \times 10^4 \times \sqrt{\frac{1}{3.3 \times 10^6 + 1.3 \times 10^{-12} \times N + 1.6 \times 10^{-30} \times N^2}}. \quad \text{(Formula 1)}$$

9. The silicon carbide semiconductor device according to claim 8, wherein X and N satisfy a Formula 2:

$$X > 3.522 \times 10^4 \times \sqrt{\frac{1}{3.3 \times 10^6 + 1.3 \times 10^{-12} \times N + 1.6 \times 10^{-30} \times N^2}}. \quad \text{(Formula 2)}$$

10. The silicon carbide semiconductor device according to claim 8, wherein a nitrogen concentration of the fourth silicon carbide layer is less than the nitrogen concentration of the third silicon carbide layer.

11. The silicon carbide semiconductor device according to claim 8, wherein a nitrogen concentration of the fourth silicon carbide layer is less than the nitrogen concentration of the first silicon carbide layer.

12. The silicon carbide semiconductor device according to claim 8, wherein a nitrogen concentration of the silicon carbide substrate is more than the nitrogen concentration of the first silicon carbide layer and less than the nitrogen concentration of the third silicon carbide layer.

13. The silicon carbide semiconductor device according to claim 8, wherein the thickness of the second silicon carbide layer is less than or equal to 5 μm.

14. The silicon carbide semiconductor device according to claim 8, wherein the thickness of the third silicon carbide layer is less than or equal to 20 μm.

* * * * *